US007071513B1

(12) United States Patent
Dyer et al.

(10) Patent No.: US 7,071,513 B1
(45) Date of Patent: Jul. 4, 2006

(54) LAYOUT OPTIMIZATION OF INTEGRATED TRENCH VDMOS ARRAYS

(75) Inventors: Terry Dyer, Largs (GB); Andrew Strachan, Santa Clara, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/975,171

(22) Filed: Oct. 28, 2004

Related U.S. Application Data

(63) Continuation-in-part of application No. 10/857,152, filed on May 28, 2004.

(51) Int. Cl.
*H01L 29/72* (2006.01)

(52) U.S. Cl. ...................... 257/329; 257/330; 257/341; 257/628; 438/259; 438/270

(58) Field of Classification Search ................ 257/329, 257/330, 341, 627, 628; 438/212, 259, 270
See application file for complete search history.

(56) References Cited

U.S. PATENT DOCUMENTS 5,410,170 A * 4/1995 Bulucea et al. ............. 257/332
5,629,558 A 5/1997 Galbiati et al. ............. 257/653
2003/0146489 A1* 8/2003 Shimizu ..................... 257/521
2004/0063291 A1 4/2004 Williams et al. ............ 438/309
2005/0161735 A1* 7/2005 Aoki et al. ................. 257/330

OTHER PUBLICATIONS

M.G.L. van den Heuvel et al., "An improved method for determining the inversion layer mobility of electrons in trench MOSFETs," (student paper), *Proc. ISPSD,* (2003), 4 pages in length.

* cited by examiner

*Primary Examiner*—Edward Wojciechowicz
(74) *Attorney, Agent, or Firm*—Stallman & Pollock LLP

(57) ABSTRACT

An economical integration of trench VDMOS devices into a conventional BCD process is provided, with the optimization of key aspects of the device layout for low $R_{ds(on)}$ area. Specifically, trench orientation, array geometry, the number of source cells between drain pickups and drain-source spacing are independently optimized. In one embodiment of the invention, the optimized device utilizes a rectangular cell array with an elongation ratio in the range of 5/3–7/3, with a ratio of 5/3 being preferred, and a cell orientation at 45° with respect to the wafer flat on a 100 wafer.

14 Claims, 11 Drawing Sheets

Design Plot of Z/A and Cell Density VS Elongation Fact for Rectangular Cells.

LAYOUT OPTIMIZATION OF INTEGRATED TRENCH VDMOS ARRAYS

RELATED APPLICATION

This application is a Continuation-In-Part of co-pending and commonly assigned U.S. application Ser. No. 10/857,152, filed on May 28, 2004, by Dyer et al., titled "Integration of Trench Power Transistors into a 1.5 μm BCD Process."

TECHNICAL FIELD OF THE INVENTION

The present invention relates to optimization of key aspects of the layout in a trench VDMOS array for low $R_{ds(on)}$ area.

BACKGROUND

As the requirements for power semiconductor applications have increased, integrated circuit (IC) technology has been developed that integrates DMOS devices with high performance Bi-polar CMOS components. These integrated components, known in the industry as BCD or BCDMOS devices, can be formed using an integrated BCD (Bi-polar-CMOS-DMOS) process, and can include one or more transistors, such as a number of high-voltage transistors on the same chip as low-voltage circuitry. These BCD devices can provide increased control and efficiency for many power IC applications. For instance, advanced BCDMOS processes can be used to optimize aspects of integrated circuits used in such devices as cameras, printers, projectors and DVD drives. In power IC applications where a number of discrete components were previously required, many of those discrete components can be replaced with a single, highly integrated BCDMOS device. In addition to improved performance, such a solution comes with added benefits such as a significant reduction in component and assembly costs.

While these BCD devices have had a marked effect on power IC applications, ever-increasing demands push chip manufacturers to further improve efficiency and performance. It is therefore desirable to improve upon existing BCD processes in devices in order to meet these demands.

DETAILED DESCRIPTION

Power MOS applications can utilize any of a number of power devices such as DMOS transistors. These DMOS devices can include lateral (LDMOS), vertical (VDMOS) and trench DMOS devices as known in the art. While lateral and vertical DMOS devices have been utilized in integrated process flows, trench DMOS devices have to this point been utilized by manufacturers making discrete components, such as a single transistor on a piece of silicon, because the steps that would be necessary to utilize a trench DMOS in an integrated flow would have a significant impact on the other circuitry created in the process. This is unfortunate, since chip manufacturers have proven that trench DMOS devices can be much more efficient than VDMOS or LDMOS devices for many applications. For example, the size and performance of a power IC device such as a BCD device can depend on a specific "on-resistance", $R_{ds(on)}$, at a particular break-down voltage, as is known in the art. It therefore can be desirable to minimize the $R_{ds(on)}$ of the device while maintaining high break-down voltages. Utilizing an integrated trench device, such as a trench VDMOS device, can offer at least a factor-of-two $R_{ds(on)}$ area advantage over a planar counterpart, such as for a 50V device.

Figure 1:
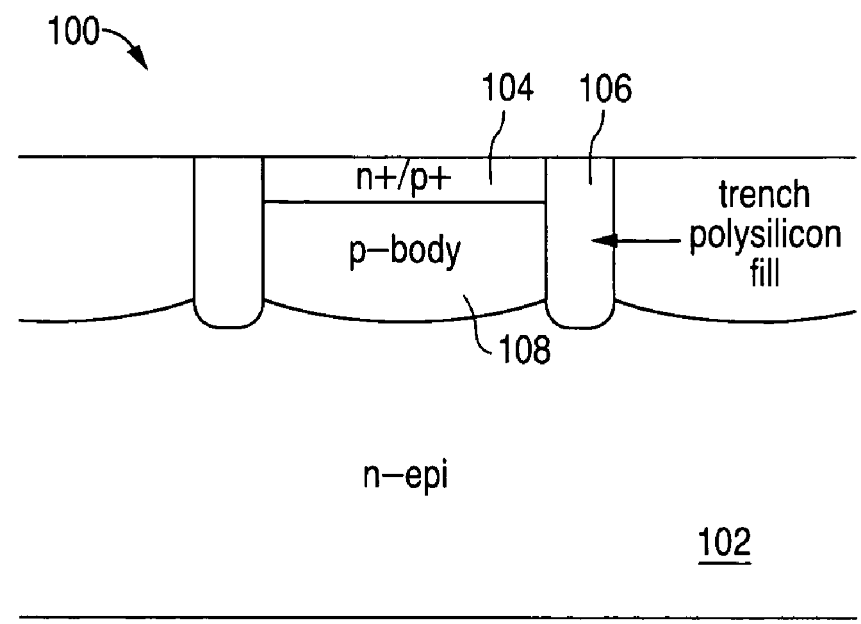
FIG. 1 is a schematic diagram of a trench VDMOS device that can be used in accordance with the concepts of the present invention.

Related application Ser. No. 10/857,152 discloses a trench VDMOS device 100 is shown in FIG. 1. In the FIG. 1 device 100, a trench 106 is shown extending into an n-epitaxy region 102. The trench 106 can be filled with a material such as doped polysilicon, such that the trench can act as a gate electrode for the transistor. A heavily doped n+/p+ region 104 can act as a source for the transistor, with the n-epitaxy region 102 serving as the transistor drain. A p-body region 108 between the source 104 and drain 102 regions can function as the channel of the transistor. This is similar to a CMOS device, except that in this arrangement the current flows through the vertical channel, instead of horizontally across a planar channel, and then vertically to the drain pickup. Systems and methods in accordance with embodiments of the present invention can allow such a trench MOSFET to be fully integrated into a standard BCD process/device.

Incorporating a trench MOS device into an existing BCD process, however, is not a trivial matter. Because trench MOS devices have been the domain of discrete device manufacturers, the trench formation processes have never had to be concerned with interfering with CMOS or bi-polar devices. The additional heat cycles used to form a trench MOSFET using existing processes can cause unacceptable and/or irreparable damage to other components in the integrated device. Therefore, existing formation processes for these trench DMOS devices may not be simply added to an existing BCD process flow. Further, simply adding a trench DMOS process to an integrated process flow, such as to replace a vertical DMOS in a 1.5 μm BCD process, can add an additional 10 different mask steps, which can be prohibitively expensive for many manufacturers and/or applications. It would be preferable to minimize the amount of disruption and/or additional steps introduced into the existing BCD process. Further, the trench process cannot simply be added to the beginning of the BCD process, since the epitaxy and field oxidations are necessary for the trench process. The trench process also cannot be done at the end of the BCD process, since the additional heat and/or heat cycles can unacceptably damage other components in the integrated device. The position in the integrated BCD process at which the trench process is injected should be selected such that maximum number of necessary elements is in place before the trench process while the overall affect on other components of the integrated device is minimized.

Related application Ser. No. 10/857,152 discloses a core planar BCD process in which 19 masks are used in conjunction with LOCOS isolation using a 2 layer metal scheme as known in the art. In existing trench DMOS processes, which are utilized for discrete devices, approximately 10 masks are needed. The systems and methods disclosed in the above-cited related application can allow an integrated trench VDMOS module to be integrated into the existing BCD process while utilizing only two masks in addition to those of the BCD process. This is possible due to the fact that many of the existing masks in the BCD process can be used with the formation of the integrated trench device, as well as the fact that the trench formation steps are inserted in the process at a location in which the additional thermal cycles involved in the trench module have a minimal effect on the other components of the integrated device.

Figure 2:
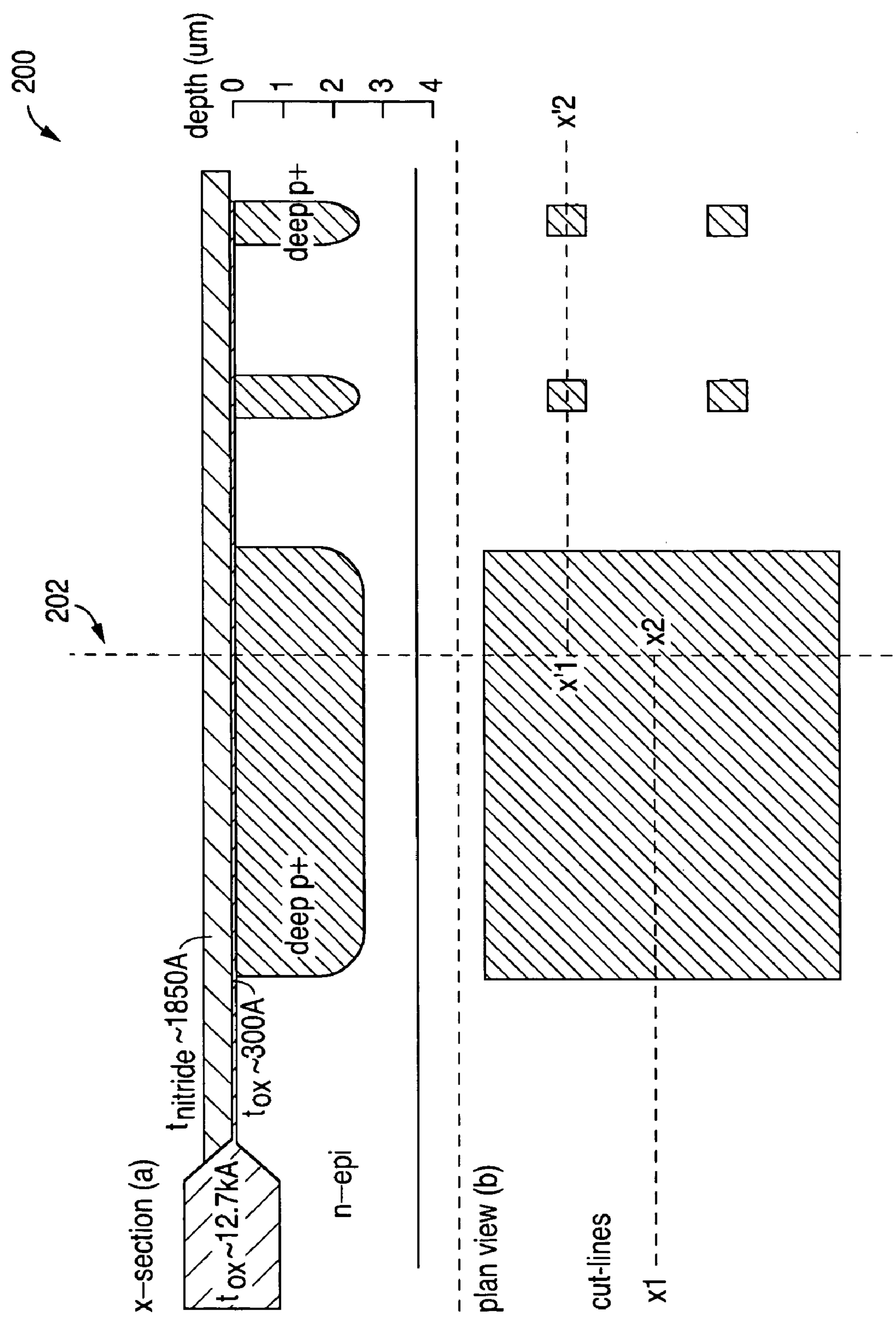
FIG. 2 is a cross-section and top view of a device at a first location within a BCD process.

Initial steps of an existing, integrated process flow can be executed to generate the epitaxy on the wafer and undergo an initial implant process, resulting in the device 200 shown in FIG. 2. FIG. 2 shows a cross-section (a) of the device 200 and a corresponding top view (b) showing the relative locations of the implant regions for this example. The portion of FIG. 2 to the right of the vertical line 202 corresponds to the transistor, and the portion to the left of the line 202 in FIG. 2 corresponds to the trench gate contact region. An area of polysilicon will be formed in the contact area that will have a metal contact laid down upon it at a later process step, in order to provide a contact between the transistor gate and the outside world.

Figure 3:
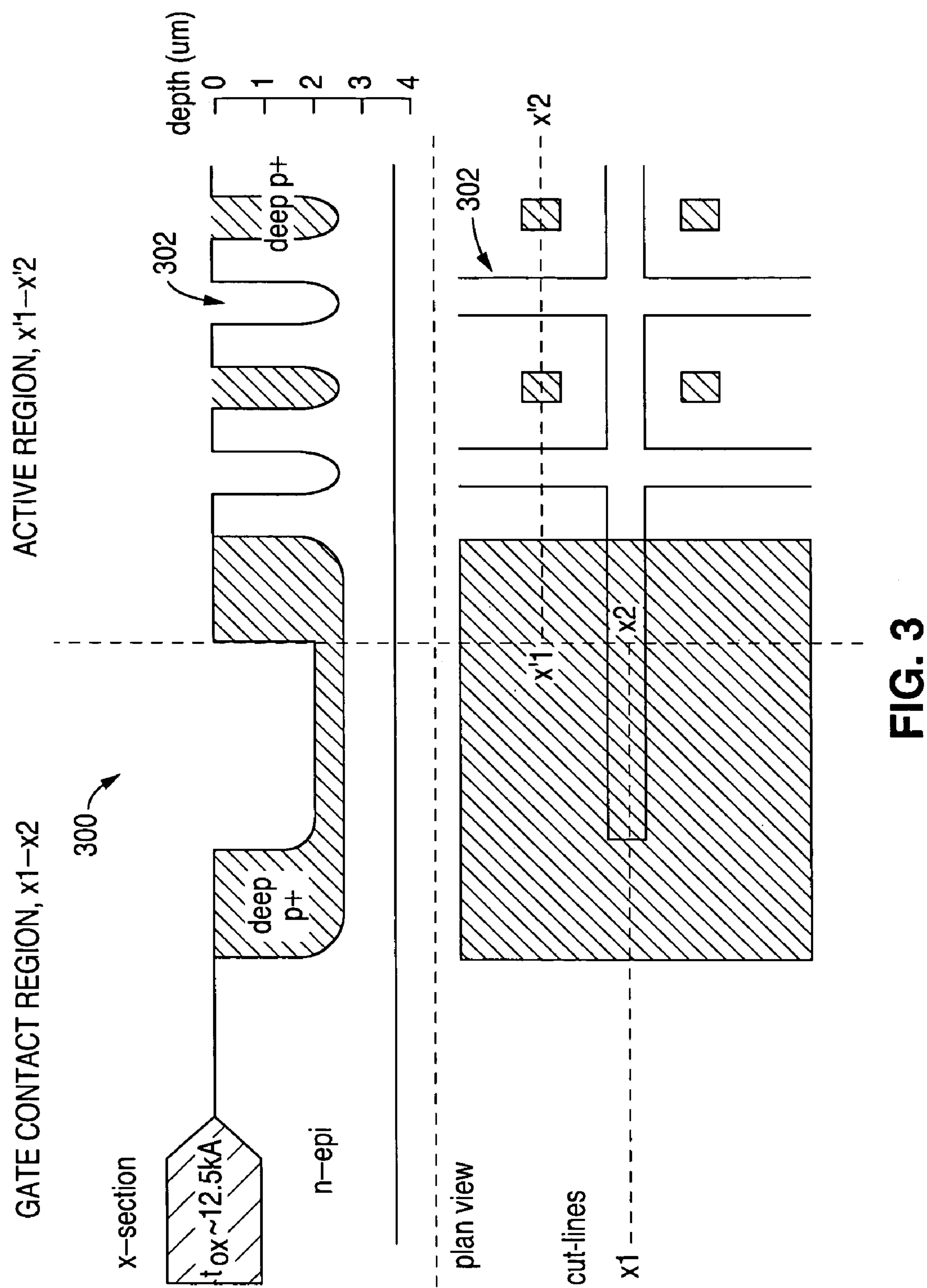
FIG. 3 is a cross-section and top view of a device at a second location within a BCD process.

A first step of an exemplary trench etch process, such as a reactive ion etch (RIE) process, can be added to the existing integrated process flow at a point following the formation of the device 200 in FIG. 2, leading to the device 300 of FIG. 3. In an exemplary RIE process, an etch rate of about ~0.7 μm/min can be used with a mask selectivity of about 40:1. A composite mask of an oxide/nitride stack can be used as a hard mask to etch a trench array 302 for each trench DMOS device, with the trench in this example being approximately 2 μm in depth and approximately 1 μm in width. An etch process such as a wet etch can be used to remove the hard mask from the front and back of the wafer after the etch.

Figure 4:
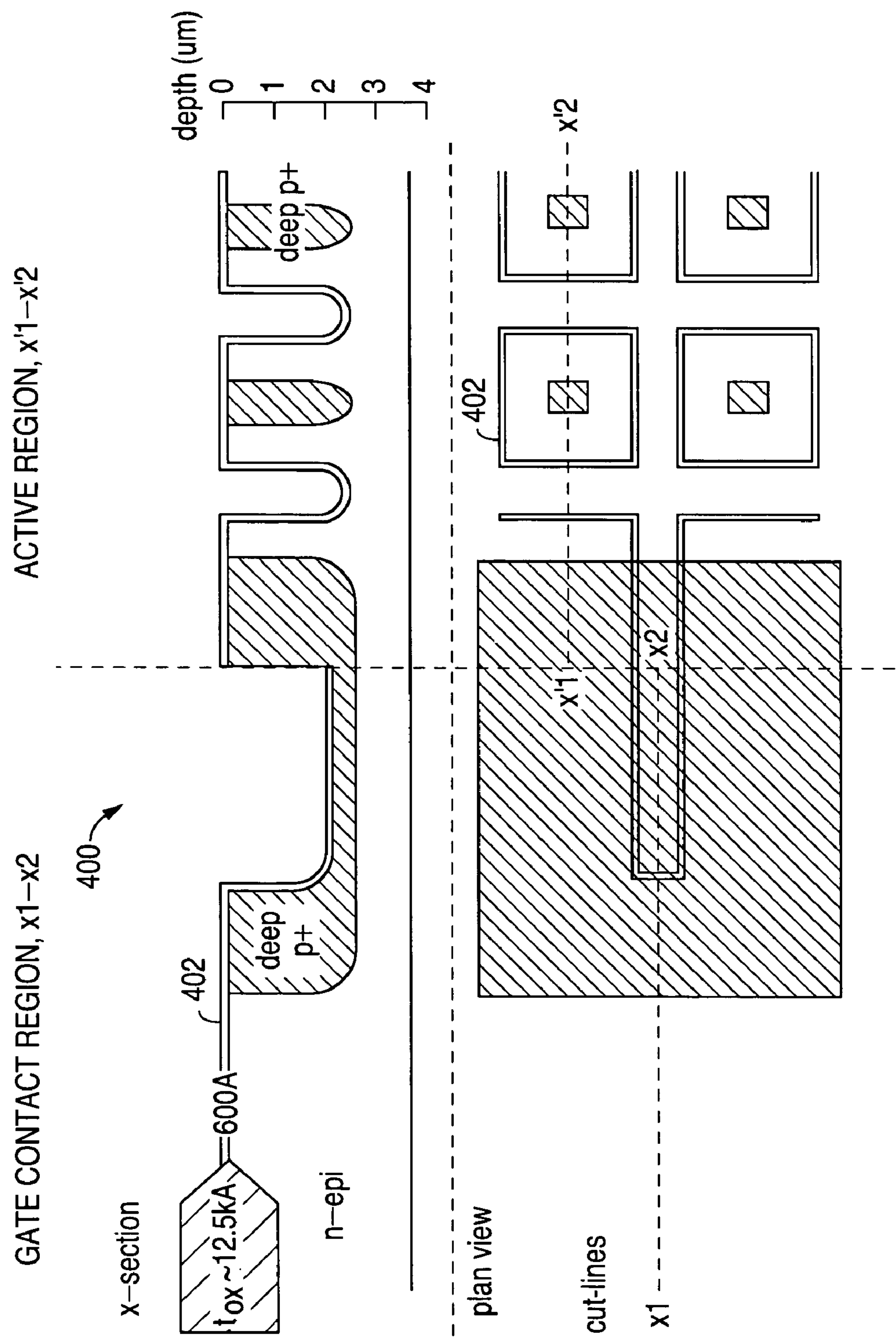
FIG. 4 is a cross-section and top view of a device at a third location within a BCD process.

An oxidation step can then be undergone, such as a 600 Å dry thermal oxidation process step, resulting in the growth of a sacrificial oxide layer 402 as shown in the device 400 of FIG. 4. This sacrificial oxide 402 then can be stripped in order to clean the sidewalls of each trench, removing any contamination and possible stress damage. The oxide can be removed using a process such as a HF dip process. One key aspect of the comparison of a discrete trench DMOS and an exemplary integrated trench DMOS created with such a process is the location of the drain contact (not shown). Discrete trench DMOS devices have the drain contact on the back side of the structure, which would not work in the integrated device with multiple trench DMOS devices on the same chip, as well as other device types. In an integrated device 400 such as that shown in FIG. 4 the drain contact can be formed from the surface of the wafer. The drain contact area can consist of a buried, heavily doped n-type layer implanted through a mask before epitaxy. This area can be linked at various locations to a deep, heavily doped n-type diffusion which can be masked and implanted after epitaxy. Such a drain contact is the same that as used on the planar vertical DMOS transistor originally in the BCD process. The drain contact is also the same as the collector contact to the NPN bipolar in the original BCD process, meaning that the addition of this type of surface drain contact to a trench DMOS requires no extra processing steps.

Figure 5:
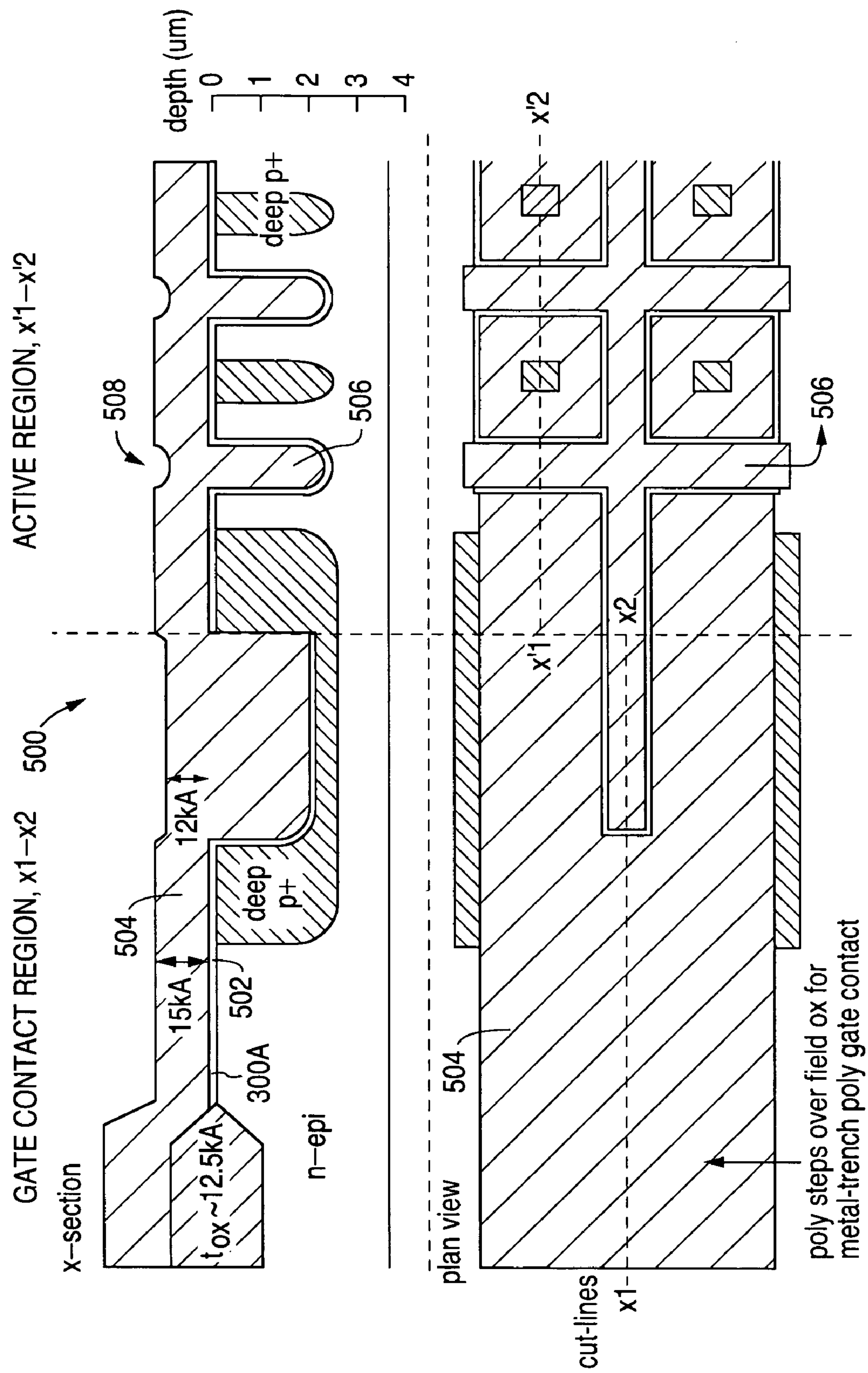
FIG. 5 is a cross-section and top view of a device at a fourth location within a BCD process.

A high quality oxide growth step can then be undergone, such as a 300 Å dry thermal oxidation process step, in order to form a trench gate oxide layer 502 such as is shown in the device 500 of FIG. 5. The oxidation is of a high quality since the trench is being used as the gate of the transistor. A polysilicon layer 504 then can be deposited, such as a 15 kÅ thick layer of polysilicon deposited by a LPCVD process in order to fill the trench 506, such that the polysilicon can act as a gate of the respective transistor. While the overall thickness of the polysilicon layer 504 can be about 15 kÅ, there can be about a 3 kÅ recess 508 over each trench 506.

The recess 508 created over each trench 506 can cause problems when attempting to etch the polysilicon layer 504. In order to address this potential problem, an etch step can be used to flatten the polysilicon layer 504 and substantially remove the recesses. It also may be necessary to thin the polysilicon layer 504 in order to be able to sufficiently dope the polysilicon deposited in the trenches. While a traditional approach would be to simply dry etch away part of the layer 504, such a traditional etch can be problematic. In order to better control the thickness of the polysilicon layer 504, the polysilicon can be partially oxidized using a process such as a HiPOx oxidation process followed by a wet etchback step. The oxidation of the polysilicon layer 504 can be much more accurately controlled than a standard dry etch step, and can be used to thin the polysilicon layer 504 to an appropriate thickness (as measured outside the trenches), such as a thickness of approximately 4 kÅ. In one example, contour plots for the differences in planarity of the polysilicon trench fill between etching the polysilicon and oxidizing the polysilicon show relative height differences on the order of a 35% variation for a dry etch process and 2% for the oxidation process. The oxidation can be a high pressure oxidation, such as HiPOx process that can have a major advantage of allowing a thick oxide to be grown at a lower temperature and time than a regular oxidation process. This minimization in the temperature and time that is added to the original BCD process can be an important feature in the integration of the trench DMOS with existing BCD process.

After a process step such as a polysilicon back etch, the polysilicon in the trench 506 can be doped through a process such as implantation or diffusion. In an implant process, the dopant can simply be implanted into the polysilicon in the trench using a standard implant technique. Using a diffusion technique, a gas such as $POCl_3$ can be placed in contact with the surface of the 4 kÅ polysilicon layer and allowed to diffuse into the polysilicide-containing trenches 506. The diffusion process can be preferable in many situations because the heat associated with the diffusion process can move the dopant more effectively throughout the polysilicon in the trench, yielding a potentially more uniformly doped trench. In applications where this heat is undesirable, or where the additional heat could negatively impact the other components in the integrated process, the implant technique can be preferred. Further, because the gate polysilicon can be partially etched away with an oxidation process, the device can behave as a planar device as the gate polysilicon flatness and thicknesses can be approximately the same. The same implants and materials can be used as on the vertical DMOS in the existing process. The thicknesses and geometry can be the same for the trench devices, such that no change is necessary to the subsequent process steps.

Figure 6:
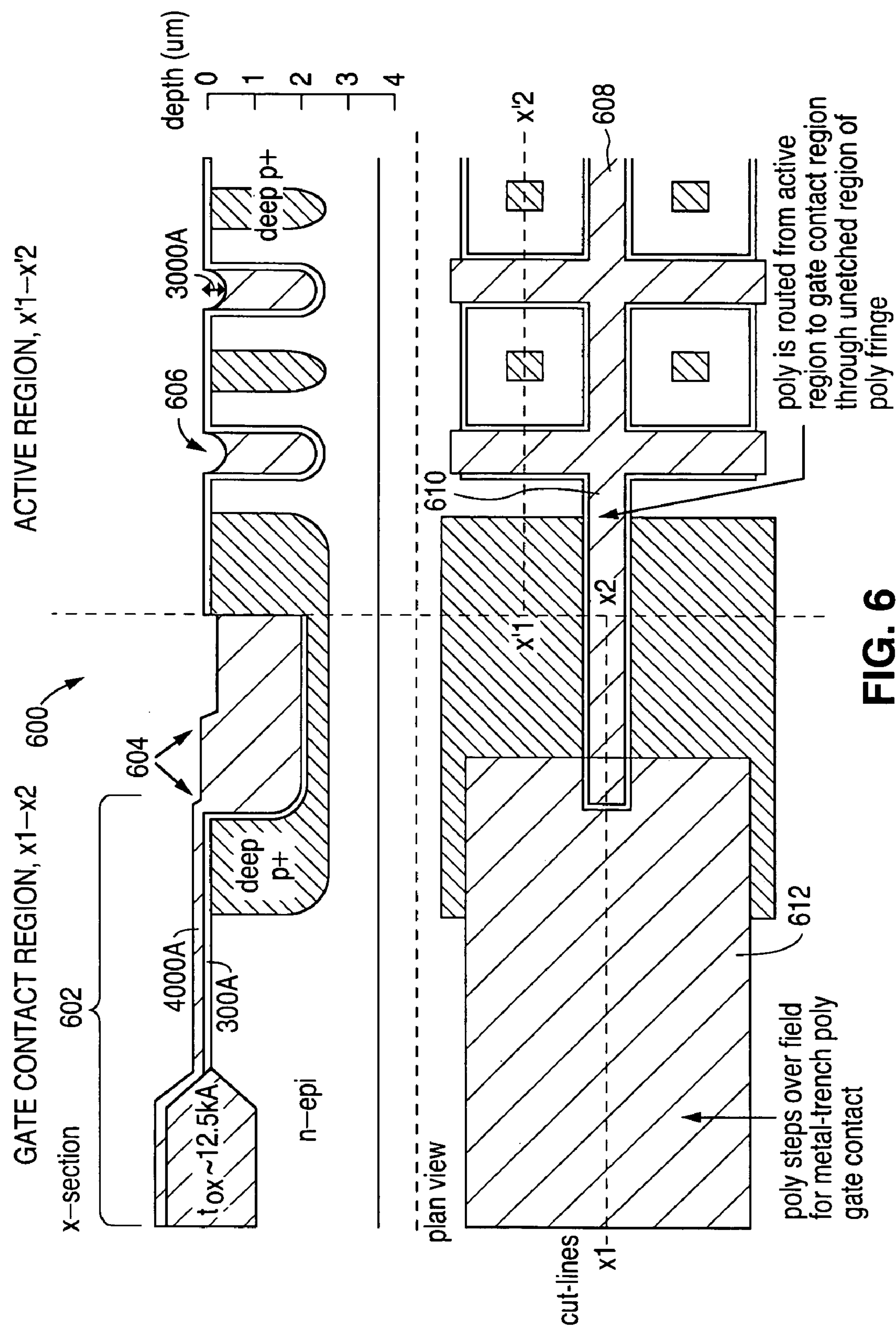
FIG. 6 is a cross-section and top view of a device at a fifth location within a BCD process.

FIG. 6 shows the device 600 after a step in the exemplary process in which a second polysilicon etch step is executed, utilizing a photoresist mask, wherein a 4 kÅ polysilicide layer 602 remains over the field for the metal-trench polysilicon gate contact, shown in the left portion of FIG. 6, but a double step 604 is formed at the trench gate and a recess 606 of about 3 kÅ is formed in each trench. As can be seen in the top view of FIG. 6, the only polysilicon 608 left in the DMOS pattern is in the trench, and the trench-contact area 610, with all the extraneous bits of polysilicon between the trenches having been removed. The only area 612 of polysilicide layer that remains is the contact area on the left. Minimizing the resultant step heights can be quite important. In an existing process, the second polysilicon layer will be the gate of the regular transistor. It can be relatively easy to etch this polysilicon layer in the original device since the layer is flat, and the etch can be more easily controlled to obtain the desired thickness. As soon as any steps are created, residual polysilicon can be left near the edges of each step after the etch process. Unfortunately, the polysilicon cannot simply be over-etched in the integrated process because the 1.5 μm lines, for example, will get smaller, such that subsequent steps would be necessary to get the thickness back to 1.5 μm. In order to keep everything as flat as possible, it can be desirable to keep the polysilicon layer contacting the trench as flat as possible. If necessary, another implant step can be done at this time, such as an adjust for CMOS devices.

Figure 7:
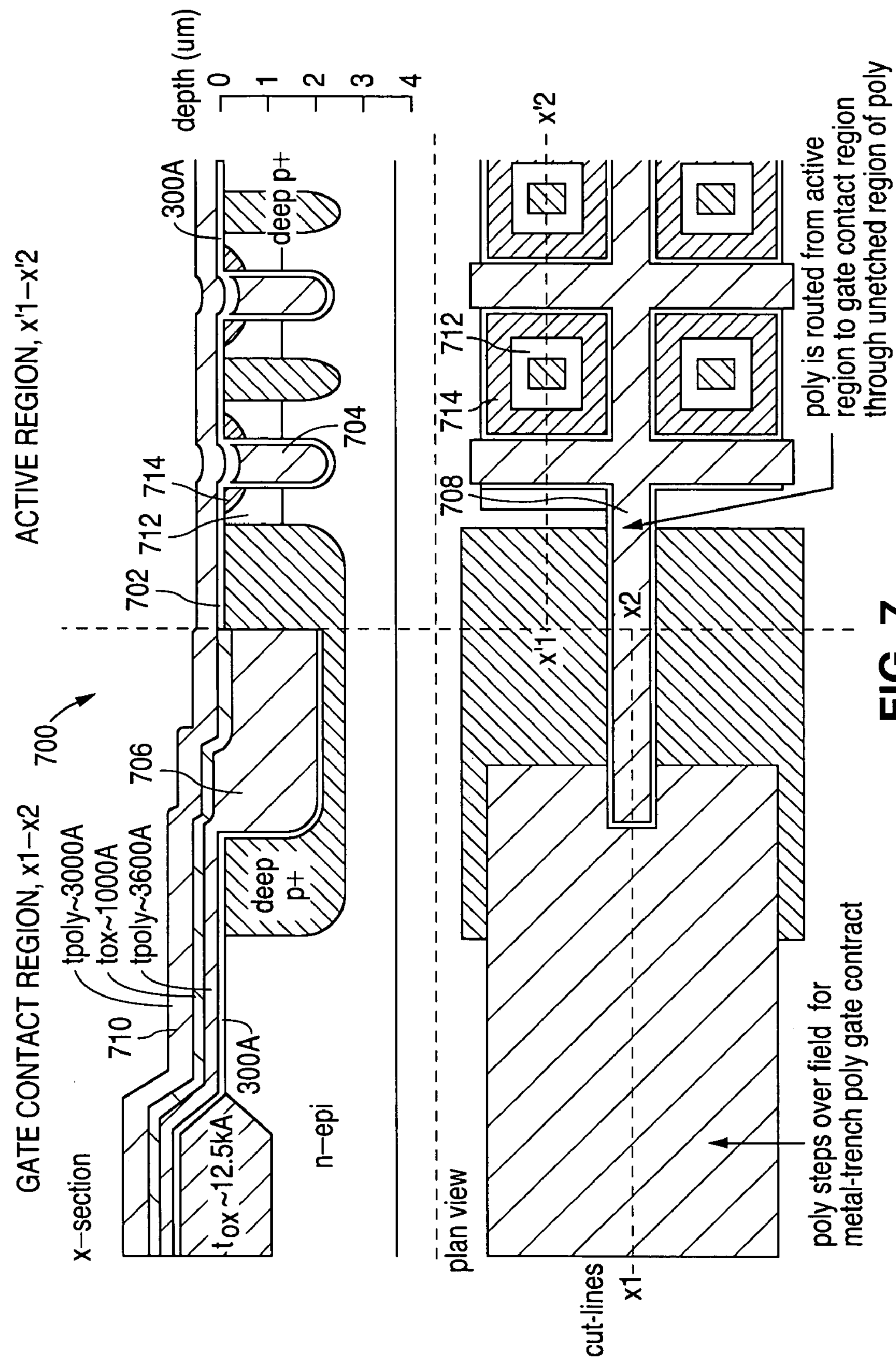
FIG. 7 is a cross-section and top view of a device at a sixth location within a BCD process.

The 300 Å trench gate oxide layer remaining over the field area can be removed from the field area, such as by using a timed etchback procedure. Another gate oxide layer 702 then can be grown on the device 700 as shown in FIG. 7, with a thickness of approximately 300 Å over the field area, which will also grow to a thickness of 3–5× that over the doped polysilicon in the trench areas 704. The oxide will grow to a thickness of about 1.5 kÅ over the trench gate polysilicon, consuming about 400 Å of the polysilicon 706. This oxide layer 702 effectively caps off all the trenches 704, such that the trenches are dielectrically isolated from the outside world, except for the un-etched region 708 of polysilicide extending from the active region to the gate contact region.

After the trenches are capped by the oxide layer, which can be formed to be sufficiently thin and flat, the integrated BCD process can continue exactly as the process existed before the trench steps were included. These steps include, for example, the creation of the p-body regions 712, which act as channels for the trench transistors, and the implanting of the source regions 714, with p-body and source diffusions being self-aligned to the trenches. The trench DMOS has then been introduced into the BCD process with only two additional etch steps, and has not necessitated any changes in the remaining steps of the BCD process. Also, a second polysilicon layer 710 can be deposited that can be used as a gate for a CMOS device elsewhere on the chip. Since there are two polysilicon layers 706, 710 separated by a thin oxide layer 702, forming a double polysilicon cap, a capacitor structure can subsequently be formed at that location. The second layer of 'power' metal from the standard process can be used to further decrease the $R_{ds(on)}$ area.

Figure 8:
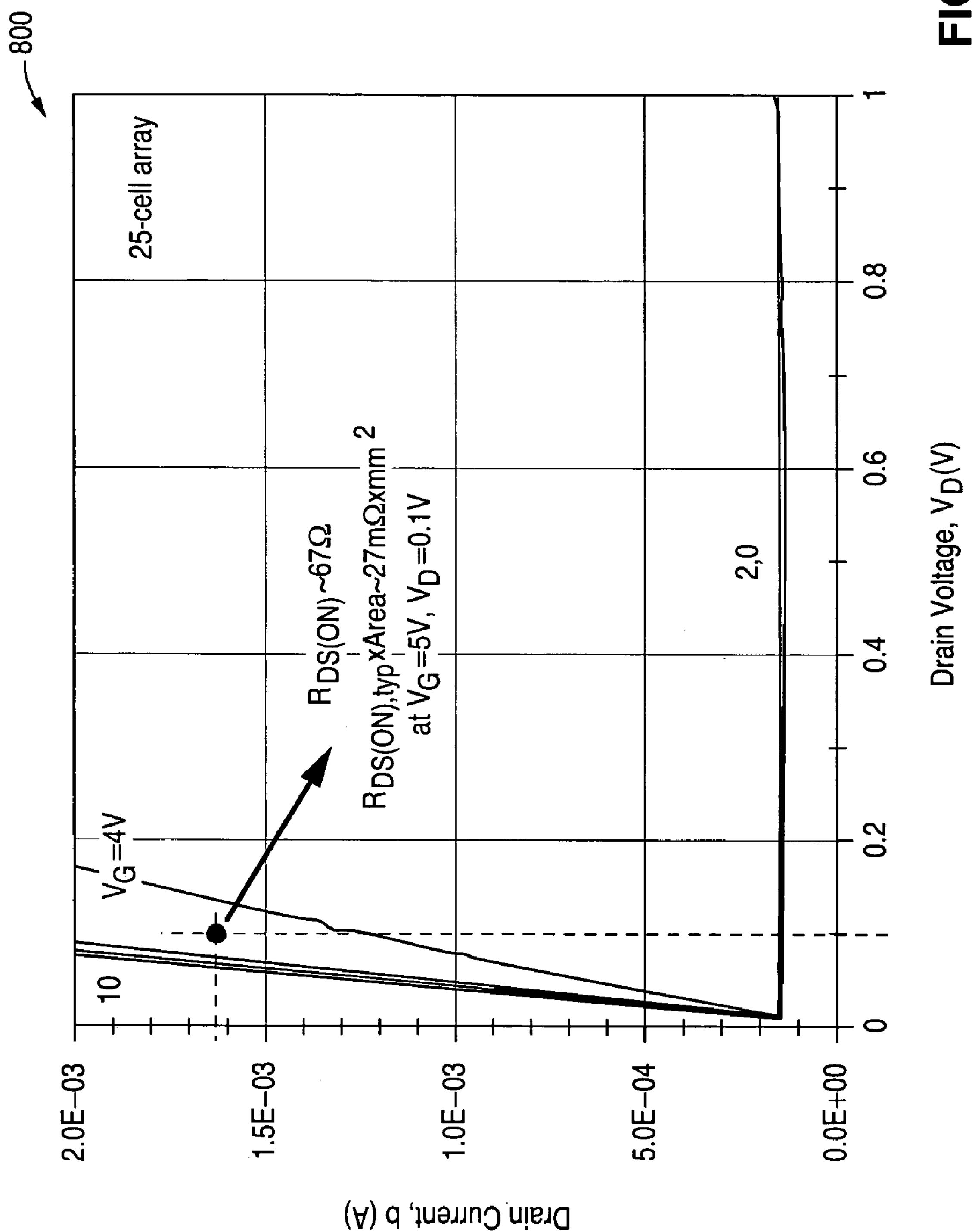
FIG. 8 is a plot showing an output characteristic of a 50V trench VDMOS device in accordance with the concepts of the present invention.

The minimum polygonal cell pitch in this exemplary process is 3.5 μm, compared with a 11 μm cell pitch for the planar VDMOS device previously utilized in the integrated process/device. This improvement represents about a 300% increase in cell density, making the integrated trench source cells comparable in density with commercial discrete trench VDMOS devices. A typical output characteristic of the 50V trench VDMOS device is shown in the plot 800 of FIG. 8. An on-resistance of 27 m□.mm2 can be achieved using the calculation method employed for discrete trench VDMOS, namely:

Area=(number of source cells)*(cell area).

However, this Area value can apply only in the limit of infinitely large arrays, since in the integrated trench VDMOS additional device area is consumed by the sinker drain contact to the buried layer.

The present invention is directed to the economical integration of trench VDMOS devices into a conventional BCD process, as described above, with the optimization of key aspects of the device layout for low $R_{ds(on)}$ area. In accordance with the invention, trench orientation, array geometry, the number of source cells between drain pickups and drain-source spacing are independently optimized to realize an optimal integrated trench VDMOS array. More specifically, and as discussed in greater detail below, the optimized device utilizes a rectangular cell array with an elongation ration in the range of 5/3–7/3 (with a 5/3 ration being preferred) and a trench orientation at 45° with respect to 100 silicon crystal wafer flat. An optimized application specific minimum number of clamp cells required to maintain acceptable robustness is also provided.

Figure 9:
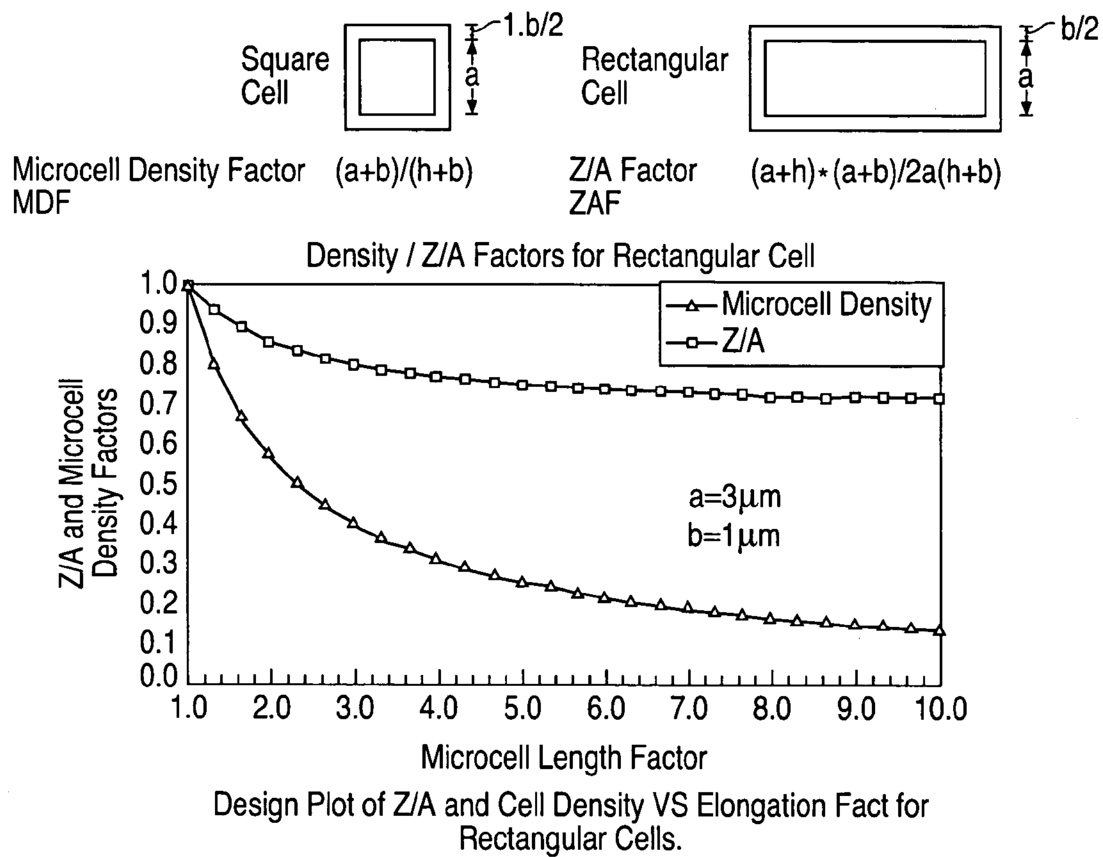
FIG. 9 is a plot showing Z/A and cell density versus an elongation factor for rectangular cells.
Figure 10:
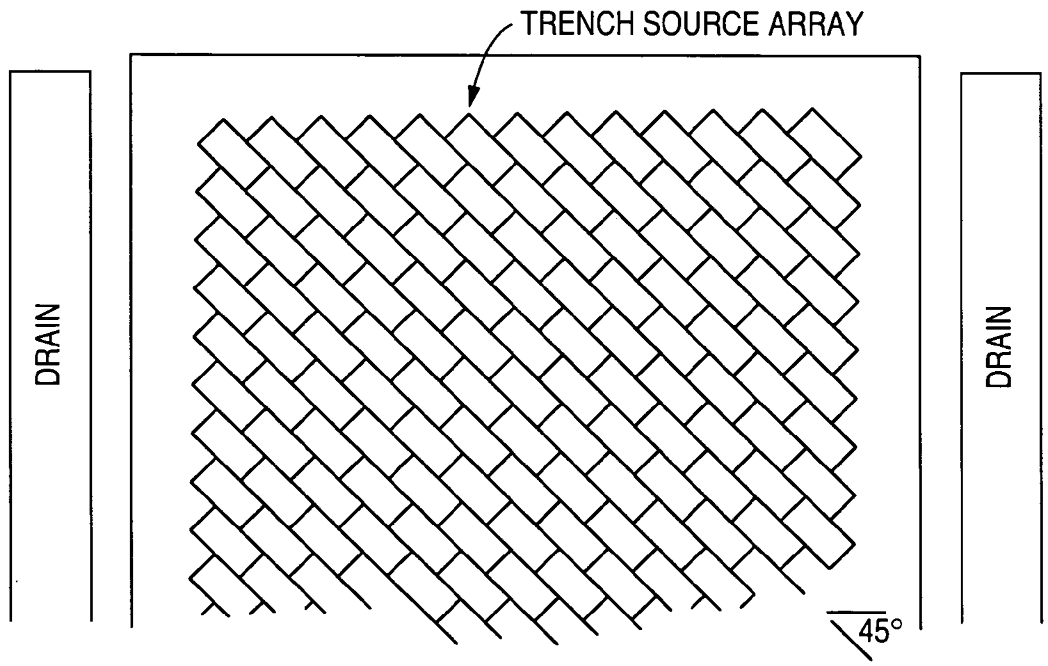
FIG. 10 is a layout view showing rectangular cells oriented at a 45° degree angle with respect to a 100 wafer flat.

As discussed in U.S. Pat. No. 5,410,170, issued on Apr. 25, 1995, to Bulucea et al., elongated closed cell arrays have a known reliability advantage over other closed cell arrays. We have found that a cell elongation ratio in the range of 5/3–7/3, and preferably a ratio of 5/3 is optimal for a trench VDMOS array of the type described above. As shown in FIG. 9, this ratio gives a Z/A penalty of about 11% with respect to a square cell and translates to an $R_{ds(on)}$ penalty of ~5.5% (considering a typical 50% contribution from channel resistance in 50V devices). We have also found that, as shown in FIG. 10, trench sidewalls of the rectangular array can be oriented at 45° with respect to a 100 wafer flat to form the channel of the VDMOS cell in the highest mobility crystal plane. Using these design parameters provides the optimal tradeoff between reliability and $R_{ds(on)}$ area.

Figure 11:
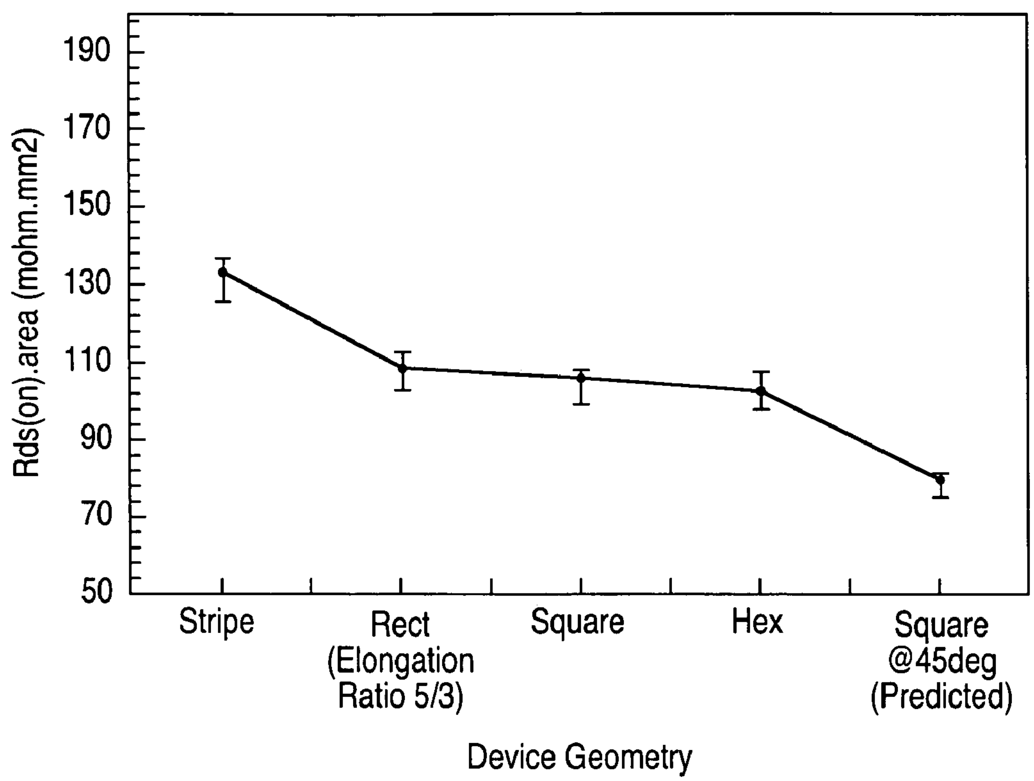
FIG. 11 is a plot showing $R_{ds(on)}$ area versus cell geometry.

Cell geometry results for a 10×50 array are shown in FIG. 11. FIG. 11 shows that a striped cell geometry is the least efficient design. A hex array is marginally more efficient than a square cell array, probably due to lower $V_t$ on hex arrays. The predicted lowest average $R_{ds(on)}$ of ~80 mohm.mm2 occurs with a square cell array if the trenches are oriented at 45° with respect to wafer flat (based on 25% reduction obtained in 25 cell arrays).

Figure 12:
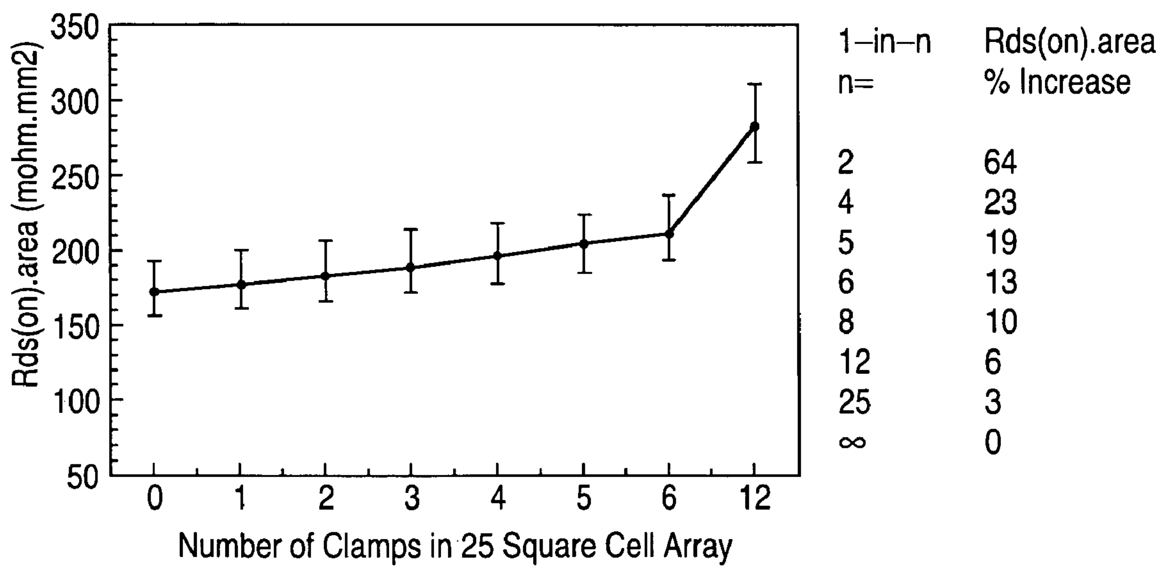
FIG. 12 is a plot showing $R_{ds(on)}$ area versus number of clamps in a cell array.
Figure 12A:
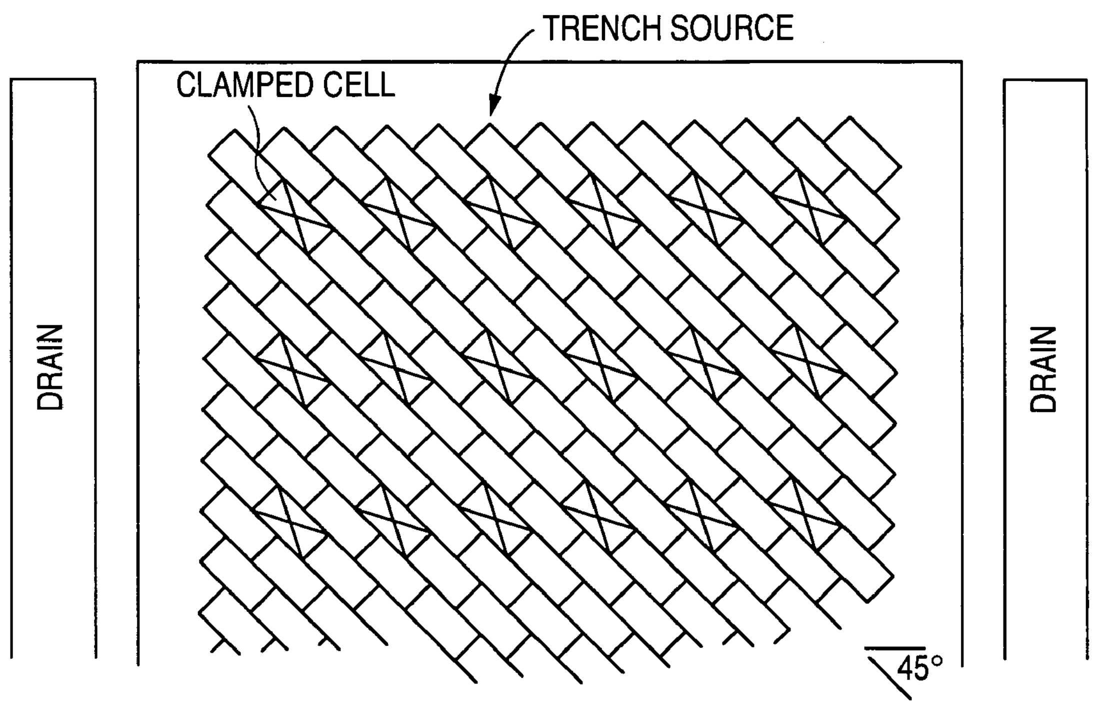
FIG. 12A is a layout view showing optimized clamped versus unclamped cells in the FIG. 10 cell array.

FIG. 12 shows the "1-in-n" clamping analysis for a 25 square cell array, i.e. the $R_{ds(on)}$ area increase for distributed voltage clamping of an un-clamped array. FIG. 12 shows an opportunity for ~16% $R_{ds(on)}$ area reduction if clamping is changed from 1-in-5 to 1-in-25. FIG. 12A shows a layout of the FIG. 10 cell array with clamping optimization.

Figure 13:
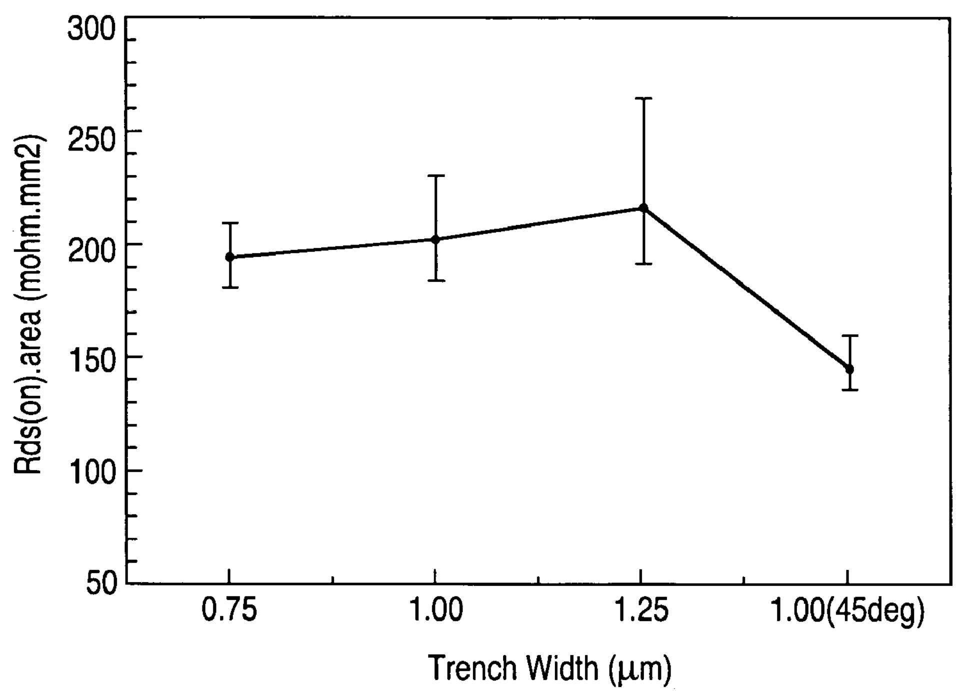
FIG. 13 is a plot showing $R_{ds(on)}$ area versus trench width.

FIG. 13 shows ~5% reduction in $R_{ds(on)}$ area is gained by reducing trench width b from 1 μm to 0.75 μm. As discussed above, an ~25% reduction in $R_{ds(on)}$ area is gained by orienting the array trenches at 45° with respect to wafer flat along the (100) plane. Similar results have been reported by other, e.g. van den Huevel et al., "An improved method for determining the inversion layer mobility of electrons in trench MOSFETs", ISPD 2003.

Figure 14:
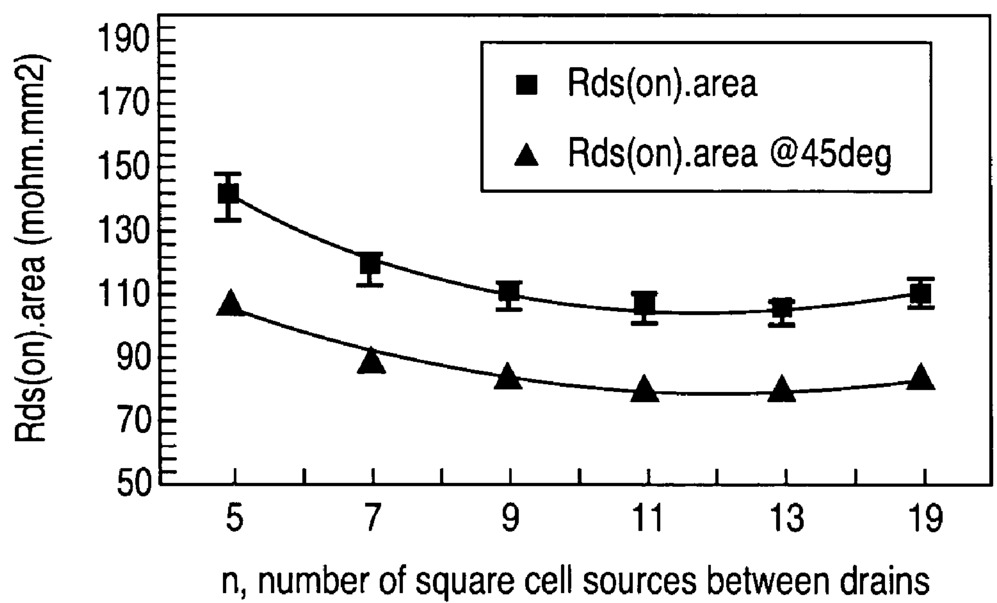
FIG. 14 is a plot showing $R_{ds(on)}$ area versus the number of cell sources between drains.

FIG. 14 provides a scaling analysis for an n×100 array. FIG. 14 shows that the optimal number of sources between drains is n~12. The minima curve represents a trade-off in current crowding against on-current. The lowest measured $R_{ds(on)}$ area=98 mohm.mm2. The predicted average $R_{ds(on)}$ area~80 mohm.mm2 if the trenches are oriented at 45° with respect to wafer flat (based on a 25% reduction obtained in 25 cell arrays). In a process such as the exemplary process described herein, the number of source cells between each drain stripe can be optimized for $R_{ds(on)}$ area as shown in FIG. 14. The default drain-pwell spacing in 1-in-n clamped arrays is 10 μm. As shown in FIG. 14, there is an opportunity for ~12% $R_{sd(on)}$ area reduction in 25 cell arrays if 7 μm drain-pwell spacing is used.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A method of forming an integrated circuit structure that includes at least one CMOS circuit element and at least one DMOS circuit element that is electrically connected to the CMOS circuit element, the method comprises:

forming a layer of epitaxial silicon having a first conductivity type on a crystalline silicon substrate having a 100 crystalline orientation;

forming a trench matrix in an upper surface of the epitaxial layer to define a plurality of spaced-apart polygonal trench source cell regions in the epitaxial layer, vertical sidewalls of the trench matrix being formed at an orientation of 45° with respect to the 100 crystalline orientation of the crystalline silicon substrate;

forming conductive material in the trench matrix to provide a conductive gate electrode for the DMOS circuit element; and for each polygonal trench source cell region, providing in the upper surface of the epitaxial layer (i) a source diffusion region having a second conductivity type that is opposite the first conductivity type, (ii) a body region having the first conductivity type, and (iii) a drain region having the second conductivity type, said body region being disposed between said source region and the drain region to provide a DMOS circuit element channel region between said source and drain regions.

2. A method as in claim 1, and further comprising:

forming the trench matrix such that each of the plurality of polygonal trench source cell regions defined by the trench matrix is a rectangle having an elongation ratio in the range 5/3–7/3.

3. A method as in claim 1, and further comprising:

forming the trench matrix such that each of the plurality of polygonal trench source cell regions defined by the trench matrix is a rectangle having an elongation ratio of 5/3.

4. A method as in claim 1, and wherein the conductive material formed in the trench matrix is separated from the epitaxial layer by intervening dielectric material.

5. A method as in claim 4, and wherein the conductive material comprises polysilicon.

6. A method as in claim 1, and wherein selected of the trench cell source regions provide clamping cells for the DMOS circuit element.

7. A method as in claim 1, and wherein the drain region is formed to be spaced-apart from the source diffusion region by a pre-selected optimum distance.

8. An integrated circuit structure that includes at least one CMOS circuit element and at least one DMOS circuit element that is electrically connected to the CMOS circuit element, the at least one DMOS circuit element comprising:

a layer of epitaxial silicon having a first conductivity type formed on a crystalline silicon substrate having a 100 crystalline orientation;

a trench matrix formed in an upper surface of the epitaxial layer to define a plurality of spaced-apart polygonal trench source cell regions in the epitaxial layer, vertical sidewalls of the trench matrix being formed at an orientation of 45° with respect to the 100 crystalline orientation of the crystalline silicon substrate;

forming conductive material in the trench matrix to provide a gate electrode for the DMOS circuit element; and for each polygonal trench source region, providing in the upper surface of the epitaxial layer (i) a source diffusion region formed therein and having a second conductivity type that is opposite the first conductivity type, (ii) a body region having the first conductivity type, and (iii) a drain region having the second conductivity type, said body region being disposed between said source region and the drain region to provide a channel region between said source and drain regions.

9. An integrated circuit structure as in claim 8, and wherein the trench matrix is formed such that each of the plurality of polygonal trench source cell regions defined by the trench matrix is a rectangle having an elongation ratio in the range 5/3–7/3.

10. An integrated circuit structure as in claim 8, and wherein the trench matrix is formed such that each of the plurality of polygonal trench source cell regions defined by the trench matrix is a rectangle having an elongation ratio of 5/3.

11. An integrated circuit structure as in claim 8, and further comprising:

dielectric material formed between the conductive material and the epitaxial layer.

12. An integrated circuit structure as in claim 11, and wherein the conductive material comprises polysilicon.

13. An integrated circuit structure as in claim 8, and wherein selected of the trench cell source regions provide clamping cells for the DMOS circuit element.

14. An integrated circuit structure as in claim 8, and wherein the drain region is spaced-apart from the source diffusion region by a pre-selected optimum distance.

* * * * *